(12) United States Patent
Song et al.

(10) Patent No.: US 11,094,721 B2
(45) Date of Patent: Aug. 17, 2021

(54) METHOD FOR MANUFACTURING ARRAY SUBSTRATE INCLUDING FORMING VIA HOLES HAVING DIFFERENT WIDTHS USING SINGLE PATTERNING PROCESS

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/399,589

(22) Filed: Apr. 30, 2019

(65) Prior Publication Data

US 2020/0006406 A1 Jan. 2, 2020

(30) Foreign Application Priority Data

Jun. 28, 2018 (CN) .......................... 201810690029.5

(51) Int. Cl.
*H01L 27/12* (2006.01)
*H01L 27/28* (2006.01)
(Continued)

(52) U.S. Cl.
CPC ........ *H01L 27/1288* (2013.01); *H01L 27/124* (2013.01); *H01L 27/1222* (2013.01);
(Continued)

(58) Field of Classification Search
CPC ............... H01L 27/1288; H01L 27/124; H01L 29/41733; H01L 29/458; H01L 29/4908; H01L 29/78633
See application file for complete search history.

(56) References Cited

U.S. PATENT DOCUMENTS

2016/0005803 A1 1/2016 Ryu et al.
2016/0071891 A1* 3/2016 Oh .................... H01L 29/66757
257/72
(Continued)

FOREIGN PATENT DOCUMENTS

CN 106486526 A 3/2017
CN 107424935 A 12/2017
(Continued)

OTHER PUBLICATIONS

First Office Action for Chinese Application No. 201810690029.5, dated Mar. 25, 2020, 9 Pages.

*Primary Examiner* — Matthew E. Gordon
(74) *Attorney, Agent, or Firm* — Brooks Kushman P.C.

(57) ABSTRACT

The present disclosure provides a method for manufacturing an array substrate, an array substrate, and a display device. The method for manufacturing the array substrate includes: forming a light-shielding layer and a buffer layer in sequence on a base substrate; forming an active layer on the buffer layer, and forming a first via hole in the active layer; forming an interlayer dielectric layer on the active layer; forming a second via hole in the interlayer dielectric layer at a position corresponding to the first via hole and a third via hole in the buffer layer at a position corresponding to the first via hole by a single patterning process; forming a source/drain electrode layer on the interlayer dielectric layer, in which the source/drain electrode layer is electrically connected to the light-shielding layer through the second via hole, the first via hole and the third via hole in sequence.

9 Claims, 9 Drawing Sheets

(51) Int. Cl.
*H01L 29/417* (2006.01)
*H01L 29/45* (2006.01)
*H01L 29/49* (2006.01)
*H01L 29/786* (2006.01)
*H01L 51/05* (2006.01)
*H01L 51/10* (2006.01)
*H01L 27/32* (2006.01)

(52) U.S. Cl.
CPC ...... *H01L 27/1225* (2013.01); *H01L 27/1248* (2013.01); *H01L 27/283* (2013.01); *H01L 29/41733* (2013.01); *H01L 29/458* (2013.01); *H01L 29/4908* (2013.01); *H01L 29/7869* (2013.01); *H01L 29/78633* (2013.01); *H01L 29/78666* (2013.01); *H01L 29/78675* (2013.01); *H01L 29/78693* (2013.01); *H01L 51/052* (2013.01); *H01L 51/055* (2013.01); *H01L 51/0525* (2013.01); *H01L 51/0566* (2013.01); *H01L 51/105* (2013.01); *H01L 27/3262* (2013.01); *H01L 27/3272* (2013.01); *H01L 27/3274* (2013.01); *H01L 27/3276* (2013.01)

(56) References Cited

U.S. PATENT DOCUMENTS

2016/0093647 A1* 3/2016 Kim ............... H01L 27/3248
          349/46
2017/0062542 A1  3/2017 Jung
2018/0323347 A1  11/2018 Liu
2019/0172954 A1  6/2019 Zhou et al.

FOREIGN PATENT DOCUMENTS

CN     107799570 A    3/2018
CN     108231595 A    6/2018

\* cited by examiner

A-A

METHOD FOR MANUFACTURING ARRAY SUBSTRATE INCLUDING FORMING VIA HOLES HAVING DIFFERENT WIDTHS USING SINGLE PATTERNING PROCESS

CROSS-REFERENCE TO RELATED APPLICATION

This application claims priority to Chinese Patent Application No. 201810690029.5 filed on Jun. 28, 2018, which is incorporated herein by reference in its entirety.

TECHNICAL FIELD

The present disclosure relates to the field of display technology, in particular, to a method for manufacturing an array substrate, an array substrate, and a display device.

BACKGROUND

In the related art, when an array substrate is manufactured by using a top-gate thin film transistor, in order to ensure good electrical connection between the light-shielding layer and the source/drain electrode layer of the thin film transistor, the via holes in the interlayer dielectric layer and the buffer layer are mostly of nested hole structure, which requires two patterning processes, i.e., using two different masks to manufacture the nested holes, leading to a complicated process for manufacturing the array substrate.

SUMMARY

A first aspect of the embodiments of the present disclosure provides a method for manufacturing an array substrate, including: forming a light-shielding, layer and a buffer layer in sequence on a base substrate; forming an active layer on a side of the buffer layer facing away from the base substrate and forming a first via hole in the active layer; forming an interlayer dielectric layer on a side of the active layer facing away from the base substrate; forming a second via hole in the interlayer dielectric layer at a position corresponding to the first via hole and forming a third via hole in the buffer layer at a position corresponding to the first via hole by a single patterning process, in which a critical dimension of the second via hole is greater than critical dimensions of the first via hole and the third via hole, and orthogonal projections of the first via hole and the third via hole on the base substrate fall into a range of an orthogonal projection of the second via hole on the base substrate; and forming, a source/drain electrode layer on a side of the interlayer dielectric layer facing away from the base substrate, in which the source/drain electrode layer is electrically connected to the light-shielding layer through the second via hole, the first via hole and the third via hole in sequence.

Optionally, the forming the second via hole in the interlayer dielectric layer at the position corresponding to the first via hole and forming the third via hole in the buffer layer at the position corresponding to the first via hole by a single patterning process may include: forming the second via hole in the interlayer dielectric layer in such a manner that the orthogonal projection of the second via hole on the base substrate partially overlaps the orthogonal projection of the first via hole on the base substrate and forming the third via hole in the buffer layer in such a manner that the orthogonal projection of the third via hole on the base substrate at least partially overlaps the orthogonal projection of the first via hole on the base substrate by a single patterning process.

Further, the forming the second via hole in the interlayer dielectric layer at the position corresponding to the first via hole and forming the third via hole in the buffer layer at the position corresponding to the first via hole by a single patterning process includes: forming a first photoresist layer on the side of the interlayer dielectric layer facing away from the base substrate, in which the first photoresist layer has a pattern of the second via hole; forming the second via hole in the interlayer dielectric layer by etching a material of the interlayer dielectric layer at the position corresponding to the first via hole with the first photoresist layer as a mask, in which the second via hole is configured to expose a part of the active layer; and forming the third via hole in the buffer layer by etching a material of the interlayer dielectric layer in the first via hole and a material of the buffer layer in the buffer layer at the position corresponding to the first via hole with the active layer as a mask.

Optionally, the interlayer dielectric layer and the buffer layer are made of a same or similar material, and the forming the second via hole in the interlayer dielectric layer at the position corresponding to the first via hole and forming the third via hole in the buffer layer at the position corresponding to the first via hole by a single patterning process includes: providing a mask having a pattern of the second via hole on a surface of the interlayer dielectric layer facing away from the active layer by a single process; and forming the second via hole in the interlayer dielectric layer at the position corresponding to the first via hole and forming the third via hole in the buffer layer at the position corresponding to the first via hole by a single etching process using the mask and the active layer formed with the first via hole, respectively.

Optionally, the interlayer dielectric layer and the buffer layer are made of different materials, and the forming the second via hole in the interlayer dielectric layer at the position corresponding to the first via hole and forming the third via hole in the buffer layer at the position corresponding to the first via hole by a single patterning process includes: providing a mask having a pattern of the second via hole on a surface of the interlayer dielectric layer facing away from the active layer; forming the second via hole and removing a part of the interlayer dielectric layer formed inside the first via hole by etching the interlayer dielectric layer through a first etchant material and the mask; and forming the third via hole by etching the buffer layer through a second etchant material and the active layer formed with the first via hole.

Further, the forming the interlayer dielectric layer on the side of the active layer facing away from the base substrate includes: forming a gate insulating material layer and a gate electrode material layer in sequence on the side of the active layer facing away from the base substrate; forming a gate electrode and a gate insulating layer by etching the gate electrode material layer and the gate insulating material layer by a single patterning process; forming a source region and a drain region by doping a part of the active layer not covered by the gate insulating layer; and forming the interlayer dielectric layer on a side of the source region, the drain region and the gate electrode facing away from the base substrate.

Optionally, the forming the gate electrode and the gate insulating layer by etching the gate electrode material layer and the gate insulating material layer by a single patterning process includes: forming a third photoresist layer having a pattern of the gate electrode on a side of the gate electrode material layer facing away from the base substrate; forming the gate electrode by etching the gate electrode material layer with the third photoresist layer as a mask and reserving a part of the gate electrode material layer corresponding to the pattern of the gate electrode, and exposing a part of the gate insulating material layer not corresponding to the pattern of the gate electrode; forming a gate insulating layer by removing the part of the gate insulating material layer not corresponding to the pattern f the gate electrode also with the third photoresist layer as the mask.

Further optionally, the forming the gate electrode and the gate insulating layer by etching the gate electrode material layer and the gate insulating material layer by a single patterning process includes: forming a third photoresist layer having a pattern of the gate electrode on a side of the gate material layer facing away from the base substrate; forming the gate electrode by etching the gate electrode material layer with the third photoresist layer as a mask, and reserving a part of the gate material layer whose orthogonal projection on the base substrate at least partially overlaps an orthogonal projection of the pattern of the gate electrode on the base substrate, and exposing a part of the gate insulating material layer whose orthogonal projection on the base substrate does not at least partially overlap the orthogonal projection of the pattern of the gate electrode on the base substrate; and forming a gate insulating layer by removing the part of the gate insulating material layer whose orthogonal projection on the base substrate does not at least partially overlap the orthogonal projection of the pattern of the gate electrode on the base substrate also with the third photoresist layer as the mask.

Optionally, the first via hole is located in the source region, and the forming the source/drain electrode layer on the side of the interlayer dielectric layer facing away from the base substrate includes: forming the metal material layer on the side of the interlayer dielectric layer facing away from the active layer, in which the metal material layer is electrically connected to a part of the active layer corresponding, to the second via hole through the second via hole, and is electrically connected to the light-shielding layer through the second via hole, the first via hole and the third via hole in sequence; and forming a source electrode and a drain electrode in the source/drain electrode layer by etching the metal material layer.

Further, the forming the active layer on the side of the buffer layer facing away from the base substrate and forming the first via hole in the active layer includes: forming an active material layer on the side of the buffer layer facing away from the base substrate; forming a second photoresist layer on the active material layer, in which the second photoresist layer has a pattern of an active layer including a pattern of the first via hole; and forming the active layer and the first via hole in the active layer by etching the active material layer with the second photoresist layer as a mask.

Optionally, a smallest gap between an edge of one end of the first via hole and a gate line of the array substrate in the active layer is 4 µm to 6 µm.

A second aspect of the embodiments of the present disclosure provides an array substrate, including: a base substrate; a light-shielding layer arranged on a side of the base substrate; a buffer layer arranged on a side of the light-shielding layer facing away from the base substrate, in which the buffer layer is provided with a third via hole; an active layer arranged on a side of the buffer layer facing away from the base substrate, in which the active layer is provided with a first via hole; an interlayer dielectric layer arranged on a side of the active layer facing away from the base substrate, in which the interlayer dielectric layer is provided with a second via hole, a critical dimension of the second via hole is greater than critical dimensions of the first via hole and the third via hole, and orthogonal projections of the first via hole and the third via hole on the base substrate fall into a range of an orthogonal projection of the second via hole on the base substrate; and forming a source/drain electrode layer on a side of the interlayer dielectric layer facing away from the base substrate, in which the source/drain electrode layer is electrically connected to the light-shielding layer through the second via hole, the first via hole and the third via hole in sequence.

Optionally, the array substrate further includes: a gate insulating layer and a gate electrode arranged between the active layer and the interlayer dielectric layer, in which the gate insulating layer is located between the active layer and the gate electrode, and an orthogonal projection of the gate insulating layer on the base substrate overlaps or substantially overlaps an orthogonal projection of the gate electrode on the base substrate.

Optionally, the active layer includes a source region, in which the first via hole is located, and a drain region, and in which the source/drain electrode layer includes a source electrode and a drain electrode, the source electrode is electrically connected to a part of the active layer corresponding to the second via hole through the second via hole, and the drain electrode is electrically connected to the light-shielding layer through the second via hole, the first via hole and the third via hole in sequence.

Optionally the gate electrode, the source/drain electrode layer, and the signal line respectively connected to the gate electrode or the source/drain electrode layer have a single-layer metal structure, a multilayer metal structure, or a stacked structure formed of a metal and a transparent conductive oxide.

Optionally, the active layer is a semiconductor active layer containing a silicon material, a semiconductor active layer containing an oxide, or a semiconductor active layer containing an organic material.

Optionally, the buffer layer, the gate insulating layer, and the interlayer dielectric layer are made of SiOx (silicon oxides), SiNx (silicon nitrides), and SiON (silicon oxynitrides); organic insulating materials; or AlOx (aluminum oxides), HfOx (hafnium oxides), TaOx (tantalum oxides).

Optionally, a smallest gap between an edge of one end of the first via hole and a gate line of the array substrate in the active layer is 4 µm to 6 µm.

A third aspect of the embodiments of the present disclosure provides a display device, including the array substrate provided by the above embodiments.

BRIEF DESCRIPTION OF THE DRAWINGS

The drawings described herein are intended to provide a further understanding of the embodiments of the present disclosure, and constitute a part of the embodiments of the present disclosure. The illustrative embodiments of the present disclosure and the description thereof are intended to illustrate the present disclosure, and do not constitute an improper limitation of the present disclosure. In the drawings.

DETAILED DESCRIPTION

In order to illustrate the above purposes, features and advantages in the embodiments of the present disclosure in a clear manner, the technical solutions in the embodiments of the present disclosure will be described hereinafter in conjunction with the drawings in a clear and complete manner. Obviously, the following embodiments merely relate to a part of, rather than all of, the embodiments of the present disclosure. Based on these embodiments, a person skilled in the art may, without any creative effort, obtain the other embodiments, which also fall within the scope of the present disclosure.

It can be understood that the a single patterning process involved in the related art and the embodiments of the present disclosure generally refer to a process of providing a mask on the surface of the material to be etched, and using the mask to pattern the material to be etched. That is to say, if a mask is made, it is considered that a patterning process is performed.

In the related art, when an array substrate is manufactured by using a top-gate thin film transistor, the structure of the top-gate thin film transistor generally includes an active layer (Active), a gate insulating layer (GI), a gate electrode (GT), an interlayer dielectric layer (ILD), and a source/drain electrode layer (S/D) arranged in sequence on one side of the base substrate.

In order to prevent the light in the external environment from directly illuminating the active layer and adversely affecting the operational characteristics of the thin film transistor, a light-shielding layer is usually arranged between the active layer and the base substrate. A buffer layer is usually arranged between the light-shielding layer and the active layer.

The light-shielding layer is formed by using a metal material. If it is always in a floating state, it is easy to accumulate free electrons in the array substrate on the surface of the light-shielding layer, resulting in a parasitic capacitance between the light-shielding layer and other conductive film layers in the thin film transistor such as source/drainage, and resulting in the drift of the threshold voltage of the thin film transistor, thereby adversely affecting the operational characteristics of the thin film transistor. Therefore, in order to avoid such problem, via holes are often formed in the interlayer dielectric layer and the buffer layer, respectively at present, so that the source/drain electrode layers of the thin film transistor can be electrically connected to the light-shielding layer through the corresponding via holes.

Figure 1:
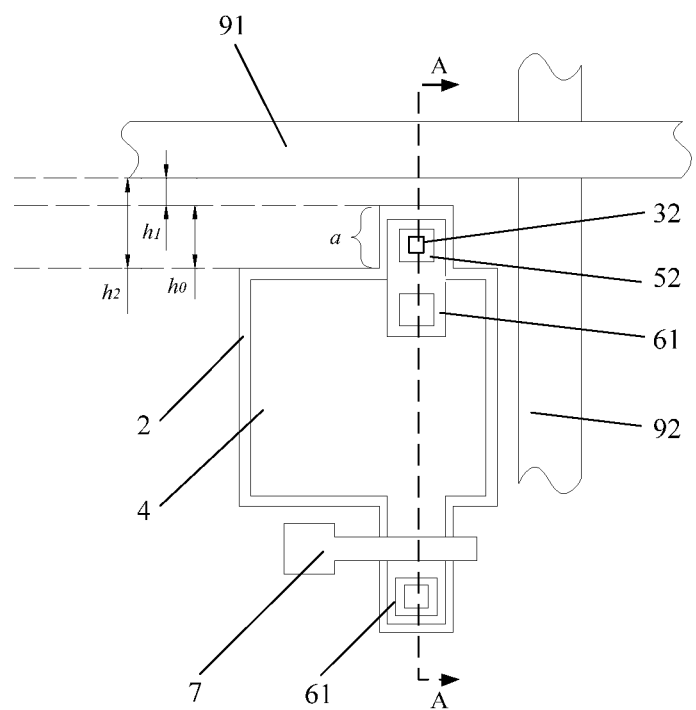
FIG. 1 is a schematic top view of an array substrate in the related art.
Figure 2:
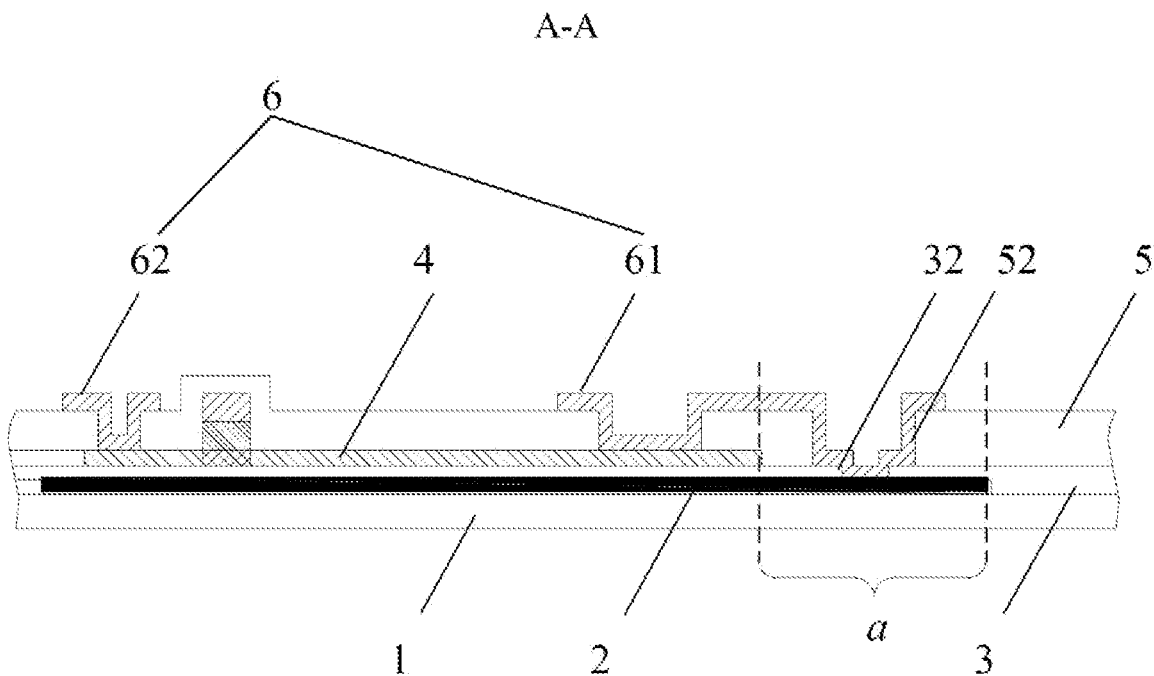
FIG. 2 is a cross-sectional view taken along line A-A of FIG. 1.

In the related art, referring to FIGS. 1 and 2, in an array substrate including a top-gate thin film transistor, in order to electrically connect the light-shielding layer 2 and the source drain electrode layer 6, a connection region α is usually arranged at a position outside the coverage area of the active layer 4, such that a part of the light-shielding layer 2 is located in the connection region α, and a via hole is arranged at a position in the interlayer dielectric layer 5 and the buffer layer 3 within the connection region α, such that the source/drain electrode layer 6 is electrically connected to the light-shielding layer 2 through the via hole.

Since the overall thickness of the interlayer dielectric layer 5 and the buffer layer 3 is generally large, in order to prevent the part connecting the source/drain electrode layer 6 and the light-shielding layer 2 from being disconnected in the via hole, it is necessary in the related art to etch the interlayer dielectric layer 5 and the buffer layer 3, respectively, through two patterning processes. The first patterning process refers to providing a first mask on the side of the interlayer dielectric layer 5 facing away from the base substrate 1, and forming an interlayer dielectric layer via hole 52 having a larger area on the interlayer dielectric layer 5 through the first mask, to expose a part of the buffer layer 3. The second patterning process refers to providing a second mask on the basis of the first mask, and forming a buffer layer via hole 32 having a smaller area at a part of the buffer layer 3 exposed by the interlayer dielectric layer via hole 32 through the second mask, to expose a part of the light-shielding layer 2. Thus, the interlayer dielectric layer via hole 52 and the buffer layer via hole 32 are combined with each other to form a nested hole structure having a larger upper opening, a smaller lower opening, and a stepped longitudinal section, thereby effectively avoiding source drain electrodes layer 6 from being disconnected.

In summary, the related art requires the above two patterning processes to achieve a good electrical connection between the light-shielding layer 2 and the source/drain electrode layer 6, and thus is easy to increase the complexity of the manufacture process for the array substrate.

Figure 5:
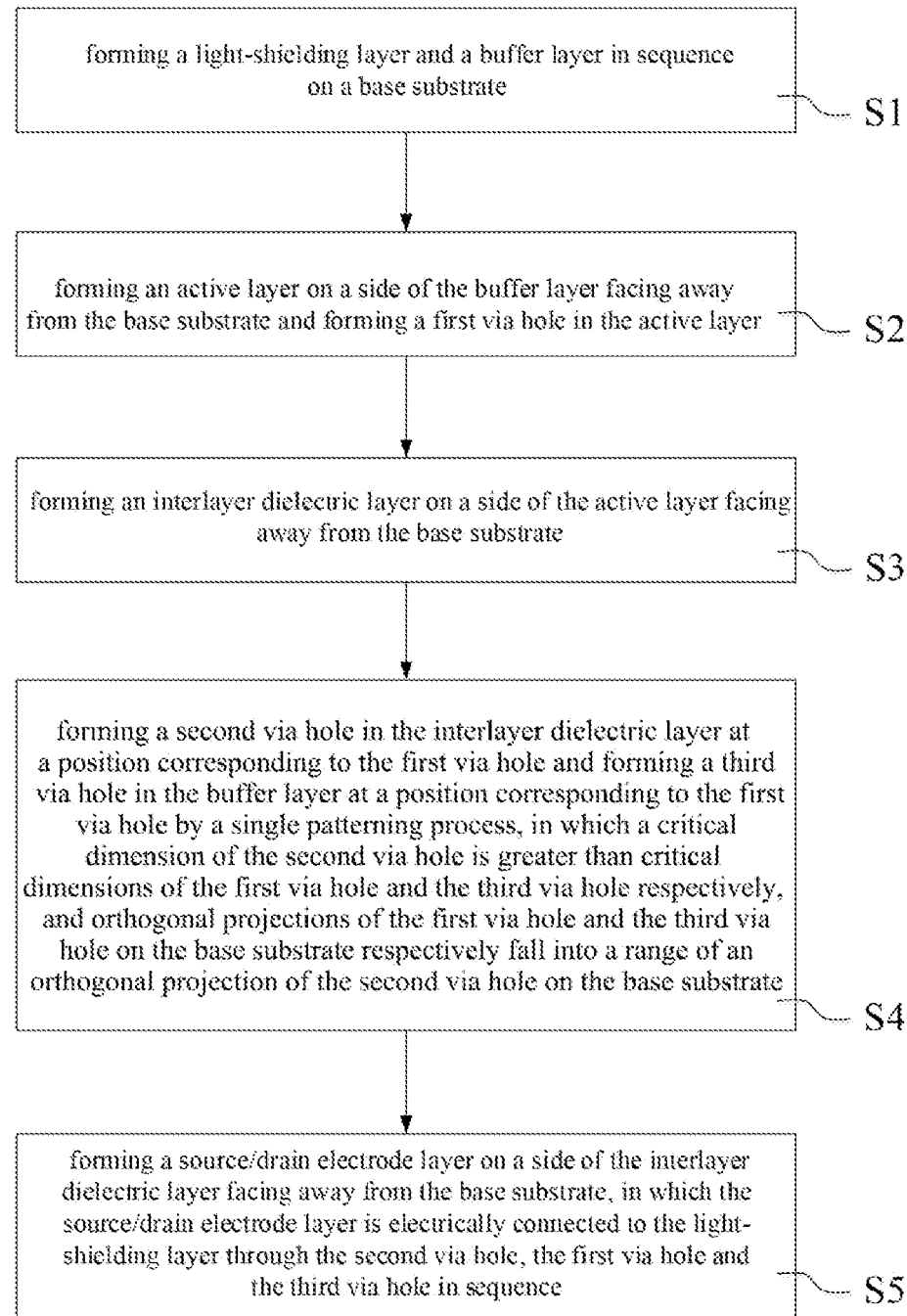
FIG. 5 is a flowchart of a method for manufacturing an array substrate according to an embodiment of the present disclosure.

The embodiments of the present disclosure provide a method for manufacturing an array substrate for simplifying the manufacture process of the array substrate. Referring to FIG. 5, the method includes the following steps.

Figure 6A:
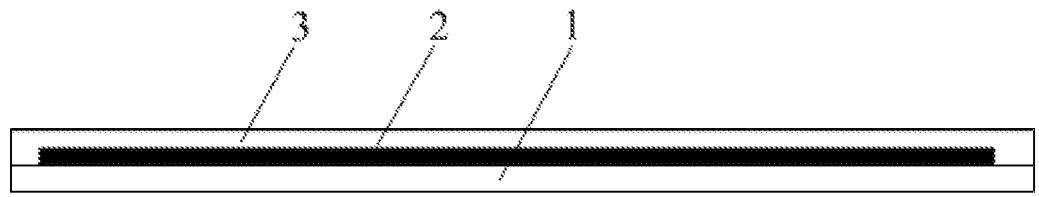
FIGS. 6A to 6L are schematic diagrams showing steps of a method for manufacturing the array substrate as shown in FIG. 5.
Figure 6B:
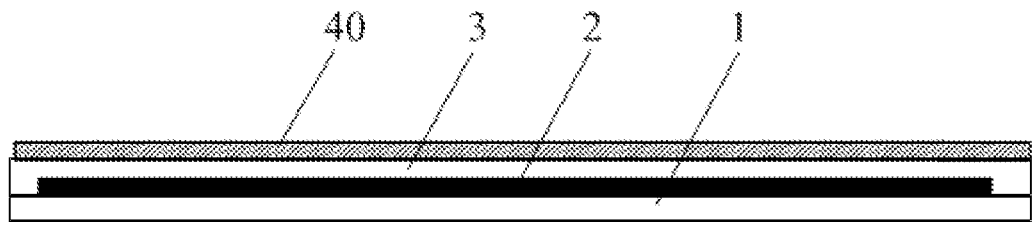
Figure 6C:
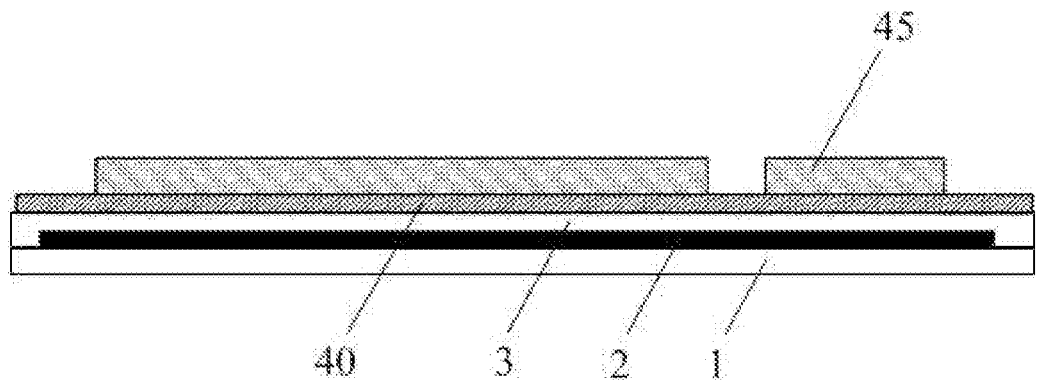
Figure 6D:
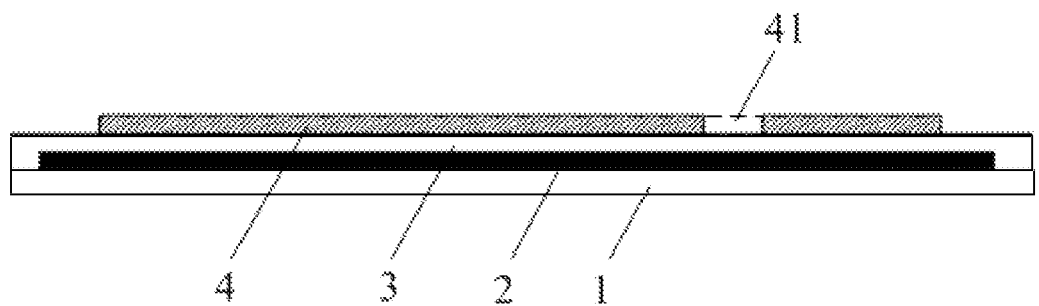
Figure 6E:
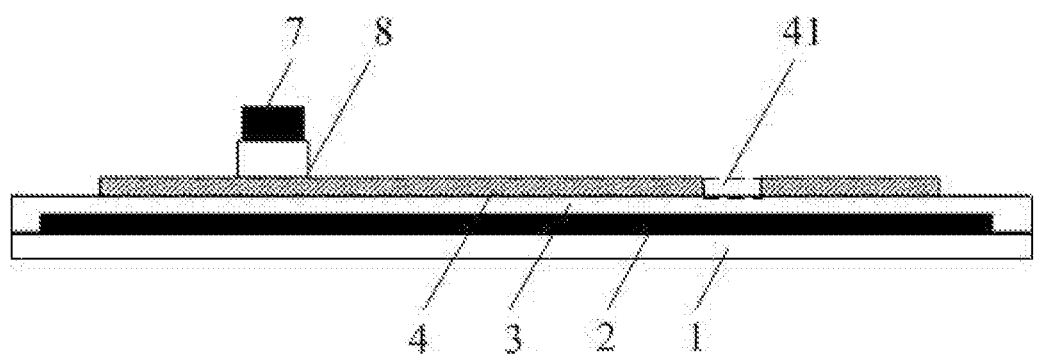

Step S1: forming a light-shielding layer 2 and a buffer layer 3 in sequence on a base substrate 1, as shown in FIG. 6A.

Optionally, the step of forming the light-shielding layer 2 and the buffer layer 3 in sequence includes: depositing a light-shielding layer material on the base substrate 1 and pattering the light-shielding layer material; and forming a buffer layer 3 on the surface of the light-shielding layer 2 facing away from the base substrate 1 and the surface of the base substrate 1 not covered by the light-shielding layer 2.

Step S2: forming an active layer 4 on a side of the buffer layer 3 facing away from the base substrate 1 and forming a first via hole 41 in the active layer 4.

Optionally, referring to FIGS. 6B to 6D and FIG. 10, this step includes:

Step S21: forming an active material layer 40 on the side of the buffer layer 3 facing away from the base substrate 1.

Step S22: forming a second photoresist layer 45 on the active material layer 40, in which the second photoresist layer 45 has a pattern of an active layer 4 including a pattern of the first via hole 41.

Step S23: forming the above active layer 4 and the first via hole 41 in the active layer 4 by etching the active material layer 40 with the second photoresist layer 45 as a mask.

It should be noted that the active material layer 40 refers to a semiconductor film layer deposited on a side of the buffer layer 3 facing away from the base substrate 1 and not patterned. In this embodiment, a pattern of the active layer 4 including the pattern of the first via hole 41 is arranged in the second photoresist layer 45, and thus the first via hole 41 may be formed synchronously during the patterning of the active layer 4, thereby limiting the need for the step of separately making the first via hole 41 and thus reducing the total number of patterning processes in the method for manufacturing the array substrate manufacture.

Continuing to refer to FIG. 5, after the step S2 is performed, the method for manufacturing the array substrate provided by the embodiment further includes the following steps.

Step S3: forming an interlayer dielectric layer 5 on a side of the active layer 4 facing away from the base substrate 1.

Optionally, referring to FIGS. 6E to 6G and FIG. 8, this step includes:

Step S31: forming a gate insulating material layer and a gate electrode material layer in sequence on the side of the active layer 4 facing away from the base substrate 1.

Step S32: forming a gate electrode 7 and a gate insulating layer 8 by etching the gate electrode material layer and the gate insulating material layer by a single patterning process.

Figure 6F:
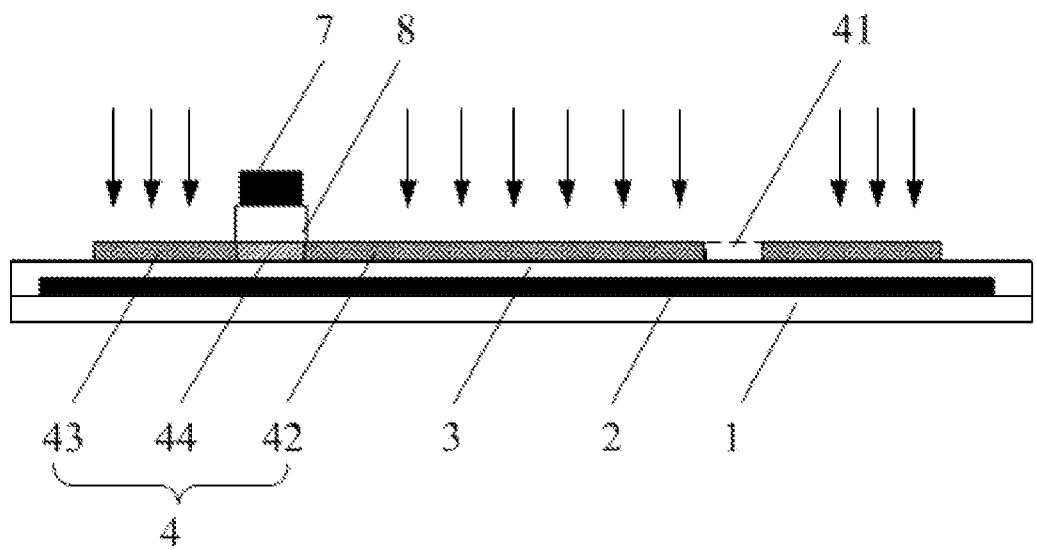
Figure 6G:
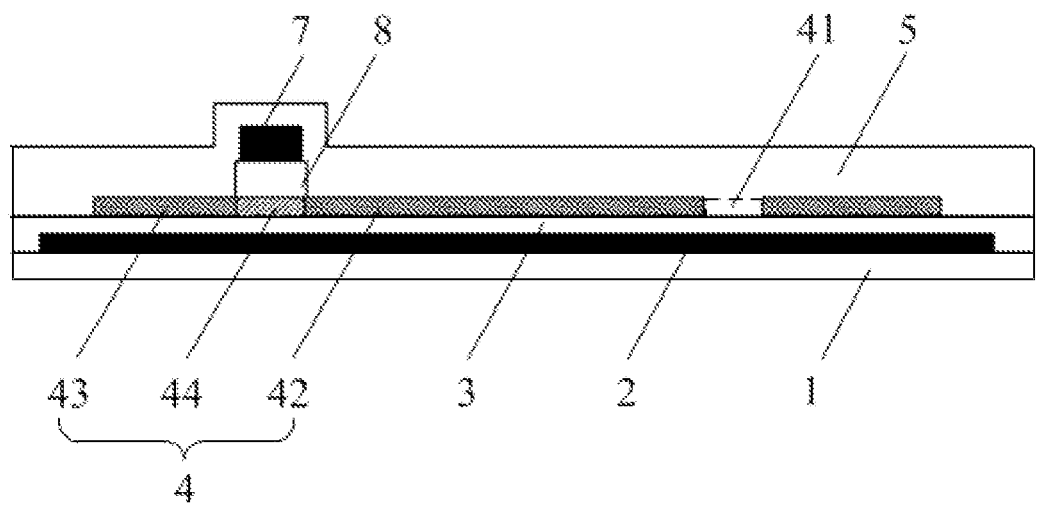
Figure 6H:
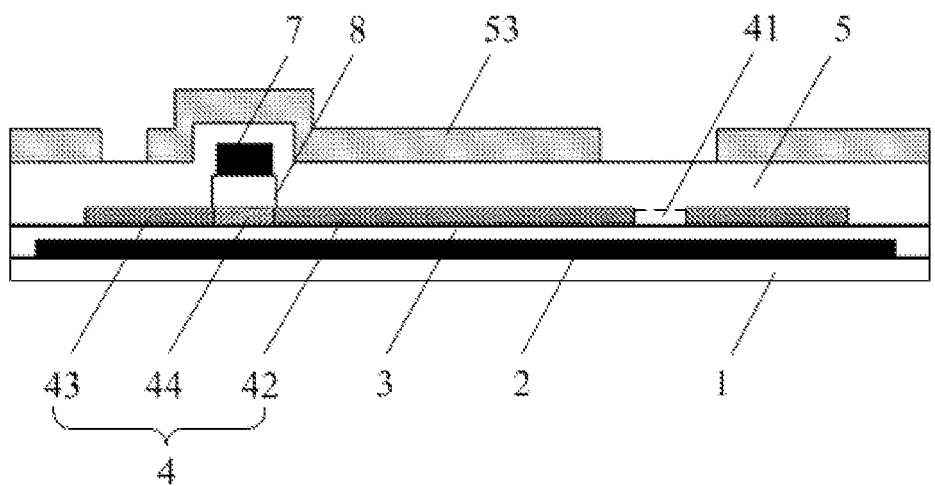
Figure 6I:
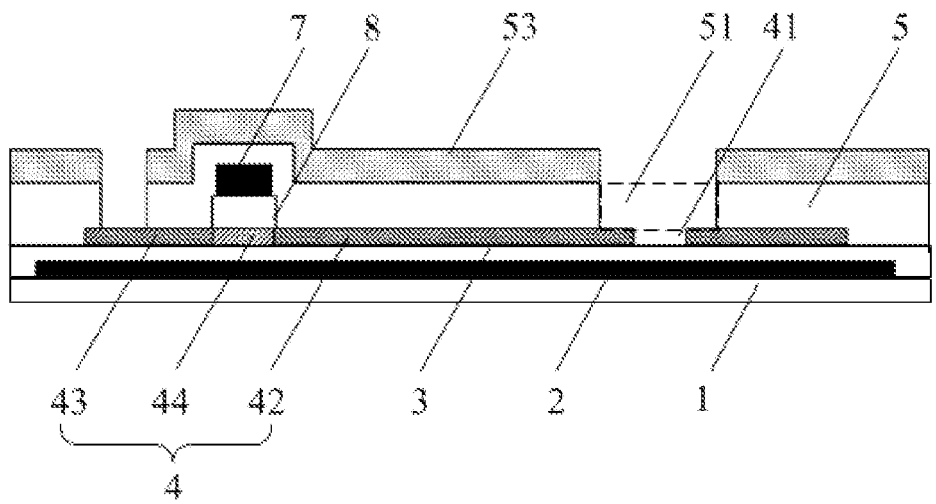
Figure 6J:
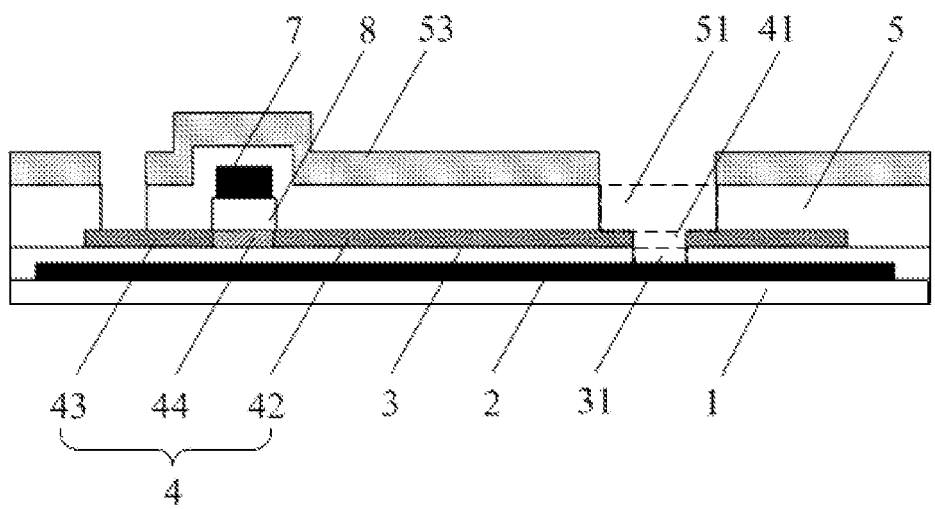
Figure 6K:
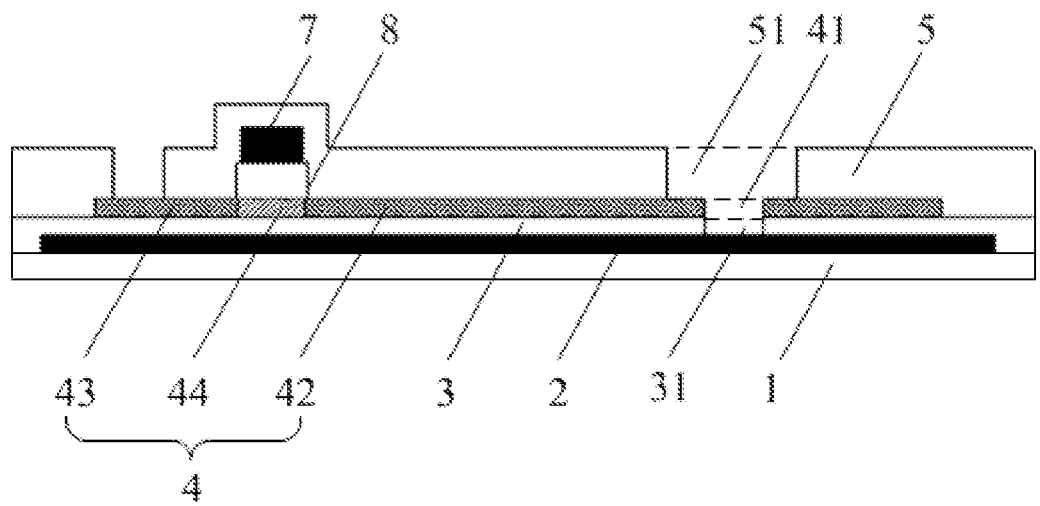

Step S33: forming a source region 42 and a drain region 43 by doping a part of the active layer 4 not covered by the gate insulating layer 8. The region between the source region 42 and the drain region 43 is a semiconductor region 44 of the active layer 4. The arrow in FIG. 6F is used to indicate the doping guide in the doping treatment of the active layer 4.

Step S34: forming the interlayer dielectric layer 5 on a side of the source region 42, the drain region 43 and the gate electrode 7 facing away from the base substrate 1.

It should be noted that the above gate insulating material layer refers to a film layer deposited on a surface of the active layer 4 facing away from the base substrate 1 and not patterned but formed of the material of the gate insulating layer 8. The above gate electrode material layer refers to a film layer deposited on a surface of the gate insulating material layer facing away from the base substrate 1 and not patterned but formed of the gate electrode material. In addition, in this embodiment, the step of forming the gate electrode 7 and the gate insulating layer 8 by etching the gate electrode material layer and the gate insulating material layer by a single patterning process may include: forming a third photoresist layer having a pattern of the gate electrode on a side of the gate electrode material layer facing away from the base substrate 1; forming the gate electrode 7 by etching the gate electrode material layer with the third photoresist layer as a mask and reserving a part of the gate electrode material layer corresponding to the pattern of the gate electrode, and exposing a part of the gate insulating material layer not corresponding to the pattern of the gate electrode; forming the gate insulating layer 8 by removing the part of the gate insulating material layer not corresponding to the pattern of the gate electrode also with the third photoresist layer as the mask; and removing the third photoresist layer.

In this embodiment, the gate electrode 7 and the gate insulating layer 8 are formed by the above manner. On one hand, they can prevent the gate electrode 7 or the gate insulating layer 8 being patterned singly, thereby being capable of reducing the total number of the patterning process. On the other hand, it can achieve a self-alignment of the gate electrode 7 and the gate insulating layer 8, thereby effectively avoiding the alignment error of the gate insulating layer 8 and the gate electrode 7 and contributing to improving the yield of the array substrate.

Continuing to refer to FIG. 5, after the step S3 is performed, the method for manufacturing the array substrate provided by the embodiment further includes the following steps.

Step S4: forming a second via hole 51 in the interlayer dielectric layer 5 at a position corresponding to the first via hole 41 and forming a third via hole 31 in the buffer layer 3 at a position corresponding to the first via hole 41 by a single patterning process, in which a critical dimension of the second via hole 51 is greater than critical dimensions of the first via hole 41 and the third via hole 31, and orthogonal projections of the first via hole 41 and the third via hole 31 on the base substrate 1 fall into a range of an orthogonal projection of the second via hole 51 on the base substrate 1.

The interlayer dielectric layer 5 and the buffer layer 3 are usually formed of a same or similar material, so that the corresponding second via hole 51 and the third via hole 31 can be formed in a single etching process using the same etchant material. The specific implementation includes: providing a mask having a pattern of the second via hole 51 on a surface of the interlayer dielectric layer 5 facing away from the active layer 4; and forming the second via hole 41 in the interlayer dielectric layer 5 at the position corresponding to the first via hole 41 and forming the third via hole 31 in the buffer layer 3 at the position corresponding to the first via hole 41 by a single etching process through the mask and the active layer 4 formed with the first via hole 41, respectively.

Of course, the interlayer dielectric layer 5 and the buffer layer 3 may be made of different materials, so that it is necessary to perform etching twice using different etchant materials when the corresponding second via hole 51 and the third via hole 31 are formed. The specific implementation includes: providing a mask having a pattern of the second via hole 51 on a surface of the interlayer dielectric layer 5 facing away from the active layer 4; forming the second via hole 51 and removing a part of the interlayer dielectric layer 5 formed inside the first via hole 41 by etching the interlayer dielectric layer 5 through a first etchant material and the mask; and then, forming the third via hole 41 by etching the buffer layer 3 through a second etchant material and the active layer 4 formed with the first via hole 31.

Therefore, in this embodiment, after a mask having the pattern of the second via hole 51 is made on the surface of the interlayer dielectric layer 5 facing away from the active layer 4, the second via hole 51 and the third via hole 31 can be formed without providing a mask having the pattern of the third via hole 31. That is, the second via hole 51 and the third via hole 31 can be formed.

For example, please refer to FIG. 6H to FIG. 6K and FIG. 7. In this embodiment, step S4 may include the following steps.

Step S41: forming a first photoresist layer 53 on the side of the interlayer dielectric layer 5 facing away from the base substrate 1, in which the first photoresist layer 53 has a pattern of the second via hole 51.

Step S42: forming the second via hole 51 in the interlayer dielectric layer 5 by etching the interlayer dielectric layer 5 with the first photoresist layer 53 as a mask, in which the second via hole 51 is configured to expose a part of the active layer 4.

Step S43: forming, the third via hole 31 in the buffer layer by etching a material of the interlayer dielectric layer 5 in the interlayer dielectric layer 5 at the position corresponding to the first via hole 41 and a material of the buffer layer 3 in the buffer layer 3 at the position corresponding to the first via hole 41 with the active layer 4 as a mask. After the etching is completed, the first photoresist layer 53 is removed.

Figure 6L:
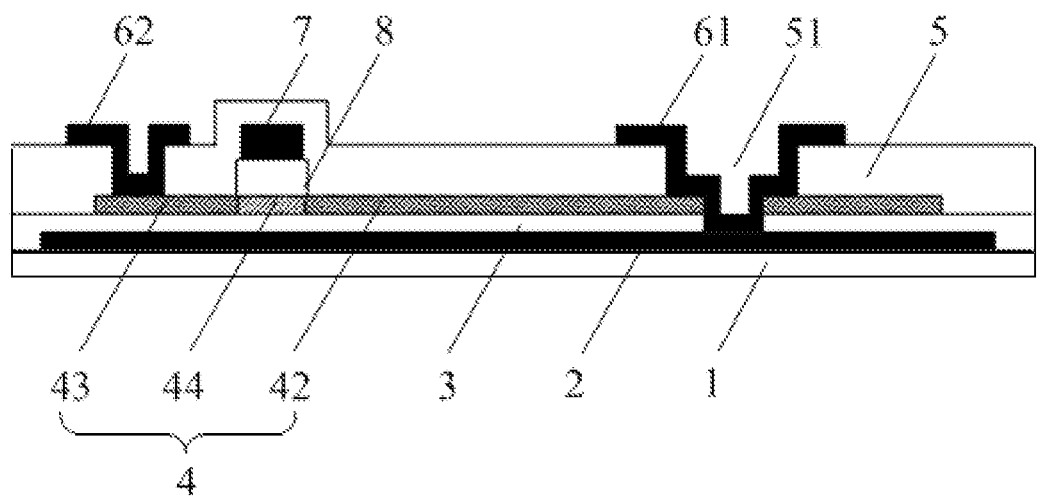
Figure 7:
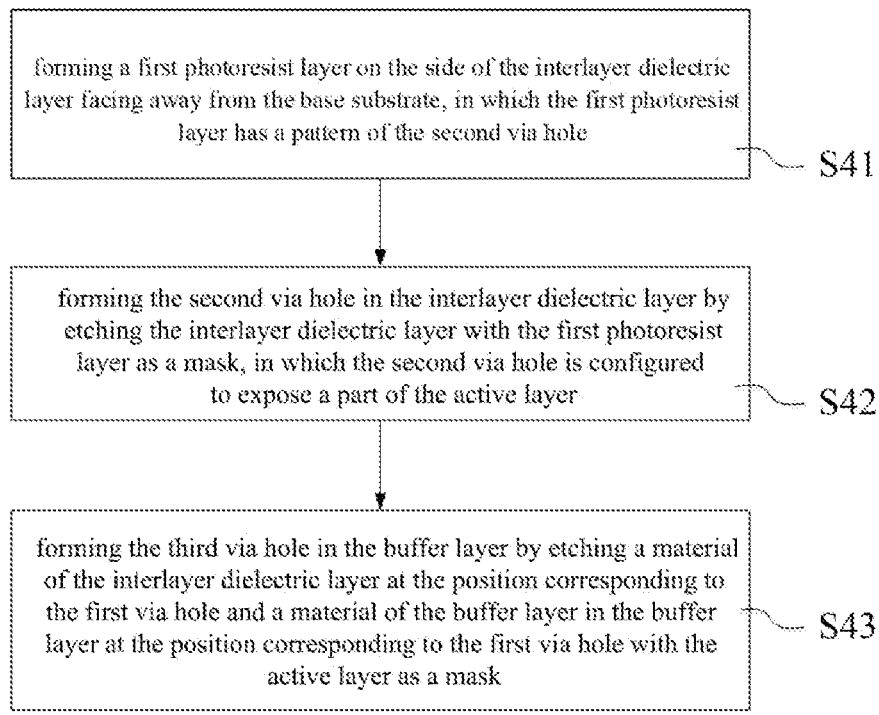
FIG. 7 is a flowchart of a method for manufacturing a second via hole and a third via hole according to an embodiment of the present disclosure.
Figure 8:
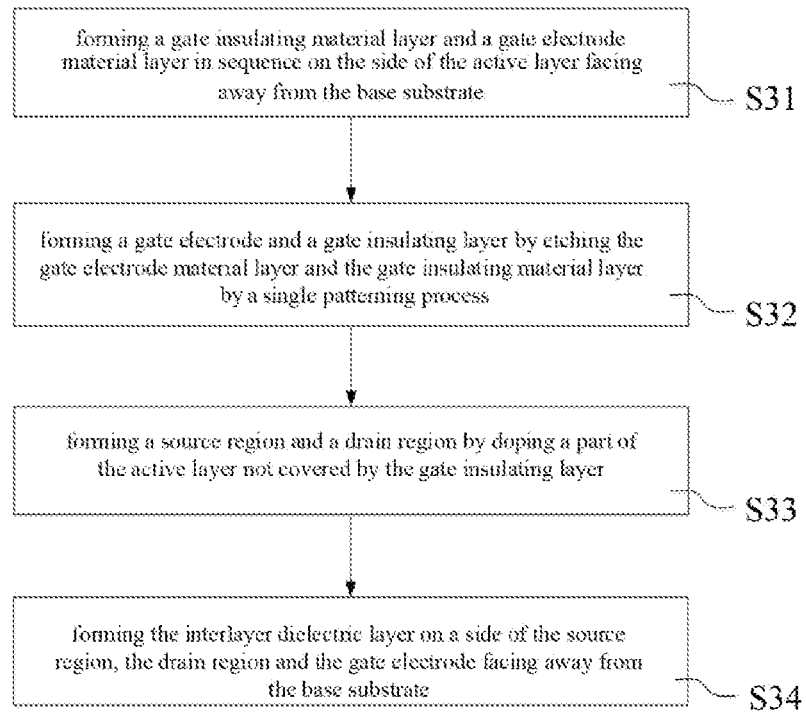
FIG. 8 is a flowchart of a method for manufacturing a gate electrode and a gate insulating layer according to an embodiment of the present disclosure.

Referring to FIG. 5 and FIG. 6L, after the above step S4 is performed, the method for manufacturing the array substrate provided by the embodiment further includes:

Step S5: forming a source/drain electrode layer 6 on a side of the interlayer dielectric layer 5 facing away from the base substrate 1, in which the source/drain electrode layer 6 is electrically connected to the light-shielding layer 2 through the second via hole 51, the first via hole 41 and the third via hole 31 in sequence.

Figure 9:
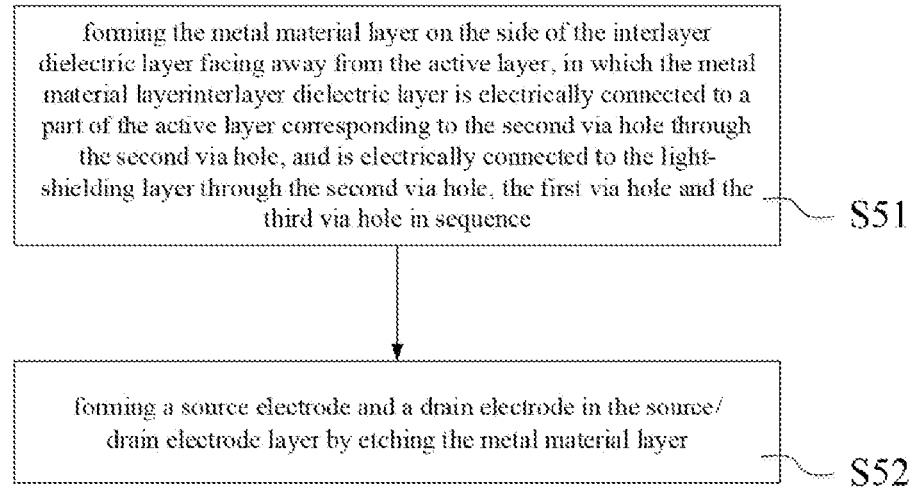
FIG. 9 is a flowchart of a method for manufacturing a source electrode and a drain electrode according to an embodiment of the present disclosure.
Figure 10:
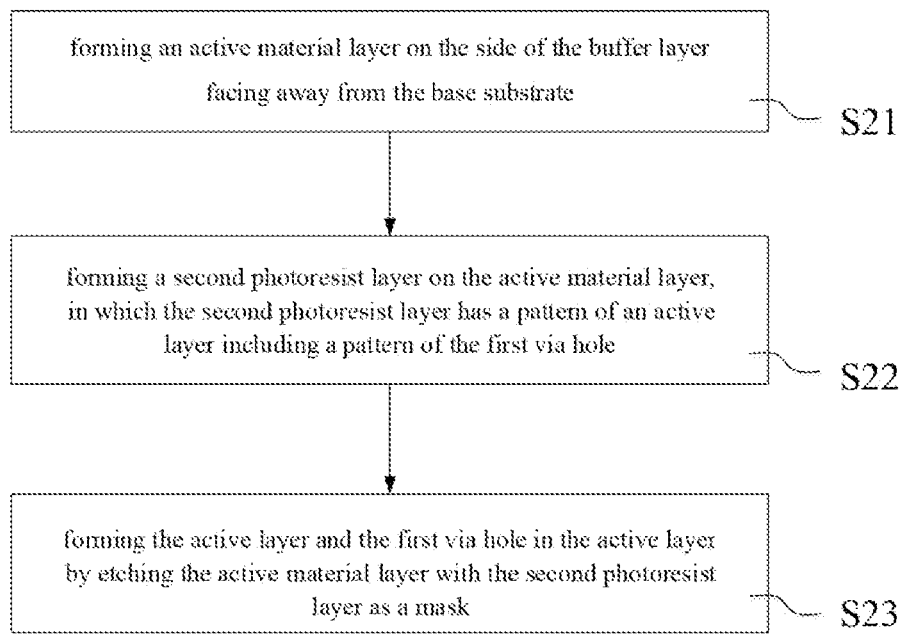
FIG. 10 is a flow chart of a method for manufacturing a first via hole according to an embodiment of the present disclosure.

Optionally, referring to FIG. 9, in this embodiment, the first via hole 41 is located in the source region 42, and step S5 may include the following steps.

Step S51: forming the metal material layer on the side of the interlayer dielectric layer 5 facing away from the active layer 4, in which the metal material layer is electrically connected to a part of the active layer 4 corresponding to the second via hole 51 through the second via hole 51, and is electrically connected to the light-shielding layer 2 through the second via hole 51, the first via hole 41 and the third via hole 31 in sequence.

Step S52: forming a source electrode 61 and a drain electrode 62 in the source/drain electrode layer 6 by etching the metal material layer.

In the technical solution provided by the embodiment of the present disclosure, by forming a first via hole 41 in the source region 42 of the active layer 4, and by forming the second via hole 51 and the third via hole 31 in regions of the first via hole 41 respectively corresponding to the region of an interlayer dielectric layer 5 and a buffer layer 3, it is capable of integrating the regions correspondingly connected with the source electrode 61 of the thin film transistor and the light-shielding layer 2 into the source region 42 of the active layer 4, thereby avoiding occupying the regions of active layer 4 in the array substrate other than the source region 42, facilitating reducing the formation area of the light-shielding layer 2, and further increasing the aperture ratio of the array substrate. Moreover, in this embodiment, the first via hole 41 is arranged in the source region 42 of the active layer 4, so that the light-shielding layer 2 is electrically connected to the source electrode 61 of the thin film transistor, and parasitic capacitance between the light-shielding layer 2 and the source electrode 61 can be avoided. Further, when the source electrode 61 receives the electrical signal from the data line 92, the electrical signal can be prevented from being disturbed by the parasitic capacitance between the light-shielding layer 2 and the source 61, and the electrical signals can be accurately transmitted, thereby facilitating improving the display effect of the array substrate.

In summary, in the method for manufacturing an array substrate provided by the embodiment of the present disclosure, after the first via hole 41 is formed in the active layer 4, the second via hole 51 can be formed in the interlayer dielectric layer 5 and the third via hole 31 can be formed in the buffer layer 3 by a single patterning process. Moreover, since the critical dimension of the second via hole 51 is greater than the critical dimensions of the first via hole 41 and the third via hole 31 respectively, and orthogonal projections of the first via hole 41 and the third via hole 31 on the base substrate 1 respectively fall into a range of an orthogonal projection of the second via hole 51 on the base substrate 1, the second via hole 51 can expose the first via hole 41 and a part of the active layer 4 located around the first via hole 41, and the third via hole 31 can expose a part of the light-shielding layer 2. Thus, when the source/drain electrode layer 6 is formed on the side of the interlayer dielectric layer 5 facing away from the base substrate 1, the source/drain electrode layer 6 is electrically connected to the light-shielding layer 2 through the second via hole 51, the first via hole 41 and the third via hole 31 in sequence, to ensure a good electrical connection performance between the light-shielding layer 2 and the source/drain electrode layer 6 of the thin film transistor.

Due to the technical solution provided by the embodiment of the present disclosure, the second via hole 51 and the third via hole 31 may be respectively formed in the interlayer dielectric layer 5 and the buffer layer 3 by a single patterning process, to ensure that the source/drain electrode layer 6 of the thin film transistor is electrically connected to the light-shielding layer 2 through the second via hole 51, the first via hole 41 and the third via hole 31 in sequence. Therefore, the technical solution provided by the embodiment of the present disclosure can simplify the manufacture process of the array substrate while ensuring a good electrical connection performance between the light-shielding layer 2 and the source/drain electrode 6 of the thin film transistor.

Please refer to FIGS. 1 to 4, in order to achieve good electrical connection between the source 61 and the light-shielding layer 2, the connection region $\alpha$ needs to be arranged separately, and a part of the light-shielding layer 2 is located within the connection region $\alpha$ in the related art, resulting in the light-shielding layer 2 having a large area. Whereas in the technical solution provided by the embodiment of the present disclosure, by forming a first via hole 41 in the active layer 4, and by forming the second via hole 51 and the third via hole 31 in regions of the first via hole 41 respectively corresponding to the region of an interlayer dielectric layer 5 and a buffer layer 3, it is capable of integrating the regions correspondingly connected with the source/drain electrode 6 of the thin film transistor and the light-shielding layer 2 into the setting region of the active layer 4, thereby avoiding occupying the regions of active layer 4 in the array substrate other than the setting region, facilitating reducing the formation area of the light-shielding layer 2, and further increasing the aperture ratio of the array substrate.

In addition, in the technical solution provided by the embodiment, the integrating the regions correspondingly connected with the source/drain electrode 6 of the thin film transistor and the light-shielding layer 2 into the setting region of the active layer 4 may effectively reduce the gap between the active layer 4 and the gate line 91, and accordingly reduce the size of the individual pixels, thereby improving the resolution of the display device. For example, referring to FIG. 1, in the related art, in order to reserve a region of the light-shielding layer 2 electrically connected to the corresponding source/drain electrode layer 6, i.e., the width $h_0$ of the connection region $\alpha$, the distance $h_2$ between the active layer 4 and the corresponding gate lines 91 is equal to the width $h_0$ of the connection region $\alpha$ plus the gap width $h_1$ between the light-shielding layer 2 and the gate line 91, that is, $h_2=h_0+h_1$. Whereas in the technical solution provided by the embodiment of the present disclosure, referring to FIG. 3, the distance between the active layer 4 and the corresponding gate line 91 is equal to the gap width $h_1$ between the light-shielding layer 2 and the gate line 91.

Therefore, the technical solution provided by the embodiment effectively reduces the gap between the active layer 4 and the gate line 91. Optionally, in this embodiment, the smallest gap between an edge of one end of the first via hole 41 and the gate line 91 of the array substrate in the active layer is 4 µm to 6 µm.

Figure 3:
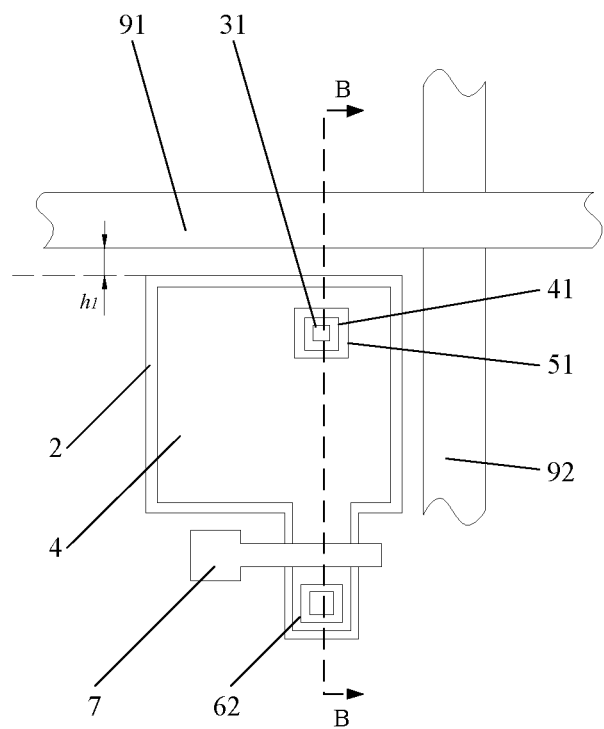
FIG. 3 is a schematic top view of an array substrate according to an embodiment of the present disclosure.
Figure 4:
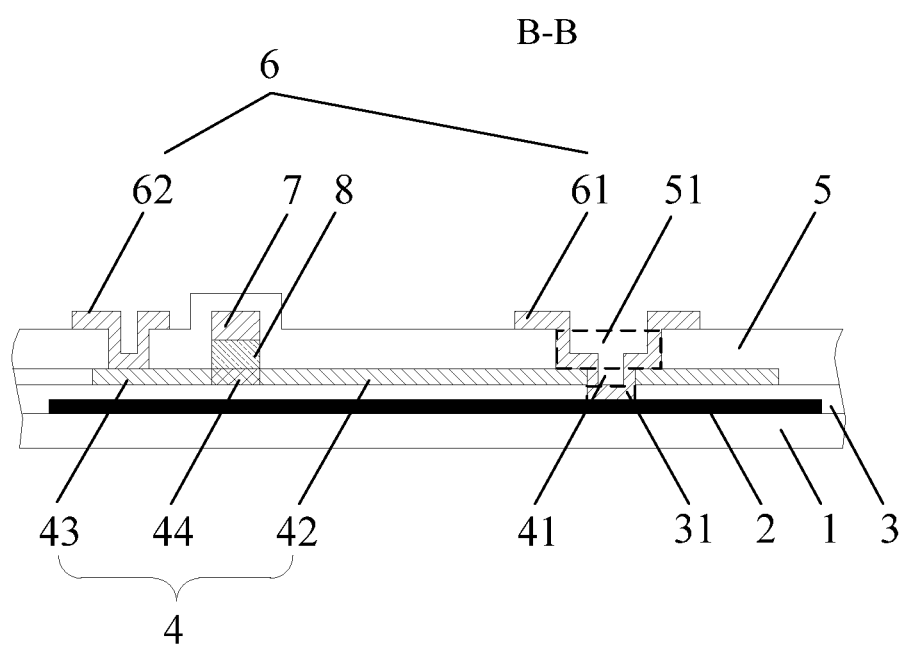
FIG. 4 is a cross-sectional view taken along line B-B of FIG. 3.

Referring to FIGS. 3 and 4, the embodiments of the present disclosure further provides an array substrate, including: a base substrate 1; a light-shielding layer 2 arranged on a side of the base substrate 1; a buffer layer 3 arranged on a side of the light-shielding layer 2 facing away from the base substrate 1, in which the buffer layer 3 is provided with a third via hole 31; an active layer 4 arranged on a side of the buffer layer 3 facing away from the base substrate 1, in which the active layer 4 is provided with a first via hole 41; an interlayer dielectric layer 5 arranged on a side of the active layer 4 facing away from the base substrate 1, in which the interlayer dielectric layer 5 is provided with a second via hole 51, a critical dimension of the second via hole 51 is greater than critical dimensions of the first via hole 41 and the third via hole 31 respectively, and orthogonal projections of the first via hole 41 and the third via hole 31 on the base substrate respectively fall into a range of an orthogonal projection of the second via hole 51 on the base substrate 1; and a source/drain electrode layer 6 arranged on a side of the interlayer dielectric layer 5 facing away from the base substrate 1, in which the source/drain electrode layer 6 is electrically connected to the light-shielding layer 2 through the second via hole 51, the first via hole 41 and the third via hole 31 in sequence. The beneficial effects of the array substrate provided by the embodiments of the present disclosure are the same as those of the method for manufacturing the array substrate in the above embodiments, and thus will not be described herein.

In this embodiment, the array substrate may be an array substrate of an organic light-emitting diode (OLED) display device, or may be an array substrate of a liquid crystal display device. Moreover, the array substrate may be a top-emitting array substrate or a bottom-emitting array substrate. In addition, in the embodiment, the light-shielding layer 2 may be made of a metal material, or may be made of other light-shielding materials having a conductive function.

In order to ensure the light-shielding effect of the light-shielding layer 2 on the active layer 4, in this embodiment, optionally, the orthogonal projection of the light-shielding layer 2 on the base substrate 1 is slightly greater than the orthogonal projection of the active layer 4 on the base substrate 1. Of course, the orthogonal projection of the light-shielding layer 2 on the base substrate 1 may also overlap the orthogonal projection of the active layer 4 on the base substrate 1, so that the light-shielding layer 2 has a smaller size, thereby further ensuring the aperture ratio of the array substrate.

It can be understood that the above active layer 4 may be a semiconductor active layer containing a silicon material, a semiconductor active layer containing an oxide, or a semiconductor active layer containing an organic material. Optionally, the active layer 4 is made of amorphous indium gallium zinc oxide (a-IGZO), nitrogen-doped zinc oxide (ZnON), indium zinc tin oxide (IZTO), amorphous silicon (a-Si), polycrystalline silicon (p-Si), hexathiophene, or polythiophene.

The gate electrode 7, the source/drain electrode layer 6, and a signal line (including the gate line 91 or the data line 92) respectively connected to the gate electrode 7 or the source/drain electrode layer 6 may particular have a single-layer metal structure, a multilayer metal structure, or a stacked structure formed of a metal and a transparent conductive oxide. For example, the single-layer metal structure is formed of a conventional metal material, or formed of an alloy material. The conventional metal material includes any one of Ag (silver), Cu (copper), Al (aluminum), Mo (molybdenum), etc., and the alloy material includes any one of an aluminum-niobium alloy (AlNd alloy), a molybdenum-niobium alloy (MoNb alloy), etc. The multilayer metal structure includes a multilayer composite structure composed of a molybdenum-niobium (MoNb) alloy layer, a copper (Cu) layer, and a molybdenum-niobium (MoNb) alloy layer. The stacked structure formed of the metal and the transparent conductive oxide includes: a stacked structure formed of an indium tin oxide (ITO) thin film, a silver (Ag) thin film, and an indium tin oxide (ITO) thin film; or a stacked structure formed of an aluminum-doped zinc oxide (AZO) thin film, a silver (Ag) thin film, and an indium tin oxide (ITO) thin film.

Further, the material for forming the buffer layer 3, the gate insulating layer 8, and the interlayer dielectric layer 5 may be conventional dielectric materials, such as SiOx (silicon oxides), SiNx (silicon nitrides), and SiON (silicon oxynitrides); or various new types of organic insulating materials; or other materials having a high dielectric constant (High k), such as AlOx (aluminum oxides), HfOx (hafnium oxides), TaOx (tantalum oxides).

Referring to FIGS. 3 and 4, in the embodiment, the array substrate further includes: a gate insulating layer 8 and a gate electrode 7 arranged between the active layer 4 and the interlayer dielectric layer 5, in which the gate insulating layer 8 is located between the active layer 4 and the gate electrode 7, and an orthogonal projection of the gate insulating layer 8 on the base substrate 1 overlaps or substantially overlaps an orthogonal projection of the gate electrode 7 on the base substrate 1. It should be noted that, in the present embodiment, the "substantially overlap" means: in the patterning process, the orthogonal projection of the gate insulating layer 8 on the base substrate 1 approximately overlaps but not strictly overlaps the orthogonal projection of the gate electrode 7 on the base substrate 1. This situation also belongs to the protection scope claimed by the present disclosure.

For example, in this embodiment, the active layer 4 of the array substrate includes: a source region 42, in which the first via hole 41 is located, and a drain region 43; the source/drain electrode layer 6 includes: a source electrode 61 and a drain electrode 62, in which the source electrode 61 is electrically connected to a part of the active layer 4 corresponding to the second via hole 51 through the second via hole 51, and the source electrode 61 is electrically connected to the light-shielding layer 2 through the second via hole 51, the first via hole 41 and the third via hole 31 in sequence. The array substrate provided by this embodiment have the structure, in which the second via hole 51 and the third via hole 31 can be respectively formed in the interlayer dielectric layer 5 and the buffer layer 3 by a single patterning process, thereby simplifying the manufacture process of the array substrate while ensuring a good electrical connection performance between the light-shielding layer 2 and the source/drain electrode layer 6 of the thin film transistor.

Optionally in this embodiment, the smallest gap between an edge of one end of the first via hole 41 and the gate line 91 of the array substrate in the active layer is 4 µm.

An embodiment of the present disclosure further provides a display device, including the array substrate as described above. The beneficial effects of the display device provided by the embodiments of the present disclosure are the same as those of the array substrate in the above embodiments, and thus will not be described herein.

In the method for manufacturing an array substrate provided by the embodiment of the present disclosure, after the first via hole is formed in the active layer, the second via hole can be formed in the interlayer dielectric layer and a third via hole can be formed in the buffer layer by a single patterning process. Since the critical dimension of the second via hole is greater than the critical dimensions of the first via hole and the third via hole respectively, and orthogonal projections of the first via hole and the third via hole on the base substrate respectively fall into a range of an orthogonal projection of the second via hole on the base substrate, the second via hole can expose the first via hole and a part of the active layer located around the first via hole, and the third via hole can expose a part of the light-shielding layer. Thus, when the source/drain electrode layer is formed on the side of the interlayer dielectric layer facing away from the base substrate, the source/drain electrode layer is electrically connected to the light-shielding layer through the second via hole, the first via hole and the third via hole in sequence, to ensure a good electrical connection performance between the light-shielding layer and the source/drain electrode layer of the thin film transistor.

In view of this, in the technical solution provided by the embodiments of the present disclosure, after the first via hole is formed in the active layer, the second via hole and the third via hole may be respectively formed in the interlayer dielectric layer and the buffer layer by a single patterning process, to ensure that the source/drain electrode layer of the thin film transistor is electrically connected to the light-shielding layer through the second via hole, the first via hole and the third via hole in sequence. Therefore, the technical solution provided by the embodiment of the present disclosure can simplify the manufacture process of the array substrate while ensuring a good electrical connection performance between the light-shielding layer and the source/drain electrode layer of the thin film transistor.

In addition, in the technical solution provided by the embodiment of the present disclosure, by forming a first via hole in the active layer; and by forming the second via hole and the third via hole in regions of the first via hole respectively corresponding to the region of an interlayer dielectric layer and a buffer layer, it is capable of integrating the regions correspondingly connected with the source/drain electrode of the thin film transistor and the light-shielding layer into the setting region of the active layer, thereby avoiding occupying the regions of active layer in the array substrate other than the setting region, facilitating reducing the formation area of the light-shielding layer, and further increasing the aperture ratio of the array substrate.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A method for manufacturing an array substrate, comprising:

forming a light-shielding layer and a buffer layer in sequence on a base substrate;

forming an active layer on a side of the buffer layer facing away from the base substrate and forming a first via hole in the active layer;

forming an interlayer dielectric layer on a side of the active layer facing away from the base substrate;

forming a second via hole in the interlayer dielectric layer at a position corresponding to the first via hole and forming a third via hole in the buffer layer at a position corresponding to the first via hole by a single patterning process, wherein a diameter of the second via hole is greater than diameters of the first via hole and the third via hole, and orthogonal projections of the first via hole and the third via hole on the base substrate fall into a range of an orthogonal projection of the second via hole on the base substrate; and forming a source/drain electrode layer on a side of the interlayer dielectric layer facing away from the base substrate, wherein the source/drain electrode layer is electrically connected to the light-shielding layer through the second via hole, the first via hole and the third via hole in sequence.

2. The method of claim 1, wherein the forming the second via hole in the interlayer dielectric layer at the position corresponding to the first via hole and forming the third via hole in the buffer layer at the position corresponding to the first via hole by a single patterning process comprises:

forming the second via hole in the interlayer dielectric layer in such a manner that the orthogonal projection of the second via hole on the base substrate partially overlaps the orthogonal projection of the first via hole on the base substrate and forming the third via hole in the buffer layer in such a manner that the orthogonal projection of the third via hole on the base substrate at least partially overlaps the orthogonal projection of the first via hole on the base substrate by a single patterning process.

3. The method of claim 1, wherein the forming the second via hole in the interlayer dielectric layer at the position corresponding to the first via hole and forming the third via hole in the buffer layer at the position corresponding to the first via hole by a single patterning process comprises:

forming a first photoresist layer on the side of the interlayer dielectric layer facing away from the base substrate, wherein the first photoresist layer has a pattern of the second via hole;

forming the second via hole in the interlayer dielectric layer by etching a material of the interlayer dielectric layer at the position corresponding to the first via hole with the first photoresist layer as a mask, wherein the second via hole is configured to expose a part of the active layer; and forming the third via hole in the buffer layer by etching a material of the interlayer dielectric layer in the first via hole and a material of the buffer layer in the buffer layer at the position corresponding to the first via hole with the active layer as a mask.

4. The method of claim 1, wherein the interlayer dielectric layer and the buffer layer are made of a same or similar material, and the forming the second via hole in the interlayer dielectric layer at the position corresponding to the first via hole and forming the third via hole in the buffer layer at the position corresponding to the first via hole by a single patterning process comprises:

providing a mask having a pattern of the second via hole on a surface of the interlayer dielectric layer facing away from the active layer; and forming the second via hole in the interlayer dielectric layer at the position corresponding to the first via hole and forming the third via hole in the buffer layer at the position corresponding to the first via hole by one single etching process using the mask and the active layer formed with the first via hole, respectively.

5. The method of claim 1, wherein the interlayer dielectric layer and the buffer layer are made of different materials, and the forming the second via hole in the interlayer dielectric layer at the position corresponding to the first via hole and forming the third via hole in the buffer layer at the position corresponding to the first via hole by a single patterning process comprises:

providing a mask having a pattern of the second via hole on a surface of the interlayer dielectric layer facing away from the active layer;

forming the second via hole and removing a part of the interlayer dielectric layer formed inside the first via hole by etching the interlayer dielectric layer through a first etchant material and the mask; and forming the third via hole by etching the buffer layer through a second etchant material and the active layer formed with the first via hole.

6. The method of claim 1, wherein the forming the interlayer dielectric layer on the side of the active layer facing away from the base substrate comprises:

forming a gate insulating material layer and a gate electrode material layer in sequence on the side of the active layer facing away from the base substrate;

forming a gate electrode and a gate insulating layer by etching the gate electrode material layer and the gate insulating material layer by a single patterning process;

forming a source region and a drain region by doping a part of the active layer not covered by the gate insulating layer; and forming the interlayer dielectric layer on a side of the source region, the drain region and the gate electrode facing away from the base substrate.

7. The method of claim 6, wherein the first via hole is located in the source region, and the forming the source/drain electrode layer on the side of the interlayer dielectric layer facing away from the base substrate comprises:

forming a metal material layer on the side of the interlayer dielectric layer facing away from the active layer, wherein the metal material layer is electrically connected to a part of the active layer corresponding to the second via hole through the second via hole, and is electrically connected to the light-shielding layer through the second via hole, the first via hole and the third via hole in sequence; and forming a source electrode and a drain electrode in the source/drain electrode layer by etching the metal material layer.

8. The method of claim 1, wherein the forming the active layer on the side of the buffer layer facing away from the base substrate and forming the first via hole in the active layer comprises:

forming an active material layer on the side of the buffer layer facing away from the base substrate;

forming a second photoresist layer on the active material layer, wherein the second photoresist layer has a pattern of an active layer comprising a pattern of the first via hole; and forming the active layer and the first via hole in the active layer by etching the active material layer with the second photoresist layer as a mask.

9. The method of claim 1, wherein a smallest gap between an edge of one end of the first via hole and a gate line of the array substrate in the active layer is 4 μm to 6 μm.

* * * * *